(12) United States Patent
Kimura et al.

(10) Patent No.: US 7,242,441 B2
(45) Date of Patent: Jul. 10, 2007

(54) METHOD FOR MANUFACTURING ELECTRO-OPTICAL DEVICE, AND ELECTRO-OPTICAL DEVICE AND ELECTRONIC DEVICE MANUFACTURED WITH THIS MANUFACTURING METHOD

(75) Inventors: Mutsumi Kimura, Kyotanabe (JP); Hiroyuki Hara, Chino (JP)

(73) Assignee: Seiko Epson Corporation, Tokyo (JP)

( * ) Notice: Subject to any disclaimer, the term of this patent is extended or adjusted under 35 U.S.C. 154(b) by 25 days.

(21) Appl. No.: 10/456,526

(22) Filed: Jun. 9, 2003

(65) Prior Publication Data

US 2004/0114061 A1 Jun. 17, 2004

(30) Foreign Application Priority Data

Jun. 10, 2002 (JP) .............................. 2002-169314

(51) Int. Cl.
*G02F 1/136* (2006.01)
*G02F 1/13* (2006.01)

(52) U.S. Cl. ........................................ 349/45; 349/187

(58) Field of Classification Search ............ 349/45–46, 349/187
See application file for complete search history.

(56) References Cited

U.S. PATENT DOCUMENTS

| | | | | |
|---|---|---|---|---|
| 5,339,180 | A | * | 8/1994 | Katoh .......................... 349/46 |
| 5,834,327 | A | | 11/1998 | Yamazaki et al. |
| 6,317,175 | B1 | * | 11/2001 | Salerno et al. ................ 349/45 |
| 6,559,905 | B1 | * | 5/2003 | Akiyama ...................... 349/45 |
| 6,583,829 | B2 | | 6/2003 | Ootsu et al. |
| 2001/0035556 | A1 | | 11/2001 | Itoh |

FOREIGN PATENT DOCUMENTS

| | | |
|---|---|---|
| CN | 1317711 A | 10/2001 |
| JP | A 59-116779 | 7/1984 |
| JP | B2 2-50630 | 11/1990 |
| JP | U 4-31299 | 3/1992 |
| JP | A 6-214254 | 8/1994 |
| JP | A 10-125930 | 5/1998 |
| JP | A 10-125931 | 5/1998 |

(Continued)

OTHER PUBLICATIONS

Shimoda et al., "Surface Free Technology by Laser Annealing (SUFTLA)," Technology Digest IEDM, pp. 289-292, 1999.

(Continued)

*Primary Examiner*—Dung T. Nguyen
(74) *Attorney, Agent, or Firm*—Oliff & Berridge, PLC

(57) ABSTRACT

To lower the cost of manufacturing a display device, the present invention comprises a step of forming on a first substrate a release layer that releases when subjected to a specific energy, a step of forming on the release layer a plurality of pixel circuits for driving the pixels of the electro-optical device, a step of causing at least one of the pixel circuits formed on the first substrate to face the position on a second circuit, used for disposing the pixel circuits, where the pixel circuits are to be disposed, and electrically connecting that pixel circuit to the second substrate, and a step of imparting energy to a part of the release layer where the pixel circuits to be released are provided, and releasing the one pixel circuit from the first substrate along with the second substrate.

20 Claims, 14 Drawing Sheets

FOREIGN PATENT DOCUMENTS

| | | |
|---|---|---|
| JP | A 10-177187 | 6/1998 |
| JP | A 11-142878 | 5/1999 |
| JP | A 2001-7340 | 1/2001 |
| JP | A 2001-166730 | 6/2001 |
| JP | A 2001-166749 | 6/2001 |
| JP | A 2001-195012 | 7/2001 |
| JP | A 2002-244576 | 8/2002 |
| JP | A 2002-260857 | 9/2002 |
| JP | A 2002-353235 | 12/2002 |

OTHER PUBLICATIONS

"Active Organic electroluminescence Displays," PFD Technology Outlook, pp. 747-762, 2001.

Kanbe et al., "Patterning of High Performance Poly(dialkyfluorene derivatives for Light-Emitting Full Color Display by Ink-jet printing," Proc. Euro. Display, Late-News Papers, pp. 85-88, 1999.

English-language version of cover page summary of Chinese Office Action.

* cited by examiner

Gradation Data (dcba)

METHOD FOR MANUFACTURING ELECTRO-OPTICAL DEVICE, AND ELECTRO-OPTICAL DEVICE AND ELECTRONIC DEVICE MANUFACTURED WITH THIS MANUFACTURING METHOD

BACKGROUND OF THE INVENTION

1. Field of the Invention

The present invention relates to a less expensive method for manufacturing a display device, which makes use of techniques of partial release and transfer to a substrate.

2. Description of the Related Art

Time division gradation drive is a digital drive method for displaying intermediate gradations by using electroluminescence (hereinafter referred to as EL) elements. This time division gradation drive method has been disclosed, for example, in the publication "Active Organic electroluminescence Displays" (2001 FPD Technology Outlook, pp. 747–762), Japanese Laid-Open Patent Applications 2001-166730 and 2001-166749, and elsewhere. This time division gradation drive method provides high image quality with a relatively simple structure.

The above publication discloses a circuit featuring one thin film transistor (hereinafter referred to as a TFT) as an example of a circuit when the electro-optical elements are liquid crystals in a pixel circuit for driving the electro-optical element provided to each pixel in a time division gradation drive method. Japanese Laid-Open Patent Application 2001-166730 discloses a circuit featuring three TFTs as an example of a circuit when electro-optical elements are used as EL elements. An advantage of a display device employing time division gradation drive is the simplicity of the circuit structure, which means that fewer TFTs or other elements are needed.

In the past, there was no good way to manufacture a display device when only a few circuit elements were used, as in a time division gradation drive method. In order to form the display area of a display device, pixel circuits including TFTs were usually manufactured by employing a semiconductor process, and while only a tiny area was needed to form pixel circuits with respect to the surface area involved in image display, this semiconductor process had to be applied to the entire substrate. Consequently, much of the material used in manufacture was wasted, which was one factor in higher manufacturing cost.

Also, the characteristics of EL elements may be compromised by the high temperatures necessary to form TFTs, and this imposed limitations on the manufacturing procedure in that the EL elements could not be formed until after the TFTs had been manufactured first. This problem can be solved by using inter-substrate transfer technology in which a TFT layer formed on a first substrate is released and transferred to a second substrate to manufacture a device, as has been discussed in detail in Japanese Laid-Open Patent Applications H10-125929, H10-125930, and H10-125931 under the title "Release Method." Even with this technology, though, since TFTs are only used in a portion of the wider display area, the release and transfer must be performed for a large-surface area substrate, which wastes material and leads to higher manufacturing cost.

In light of the above problems, it is an object of the present invention to provide a method for manufacturing a display device at a lower cost through a reduction in the number of elements used in the pixel circuits.

SUMMARY OF THE INVENTION

The present invention comprises the steps of forming on a first substrate a release layer that releases when subjected to a specific energy, forming on the release layer a plurality of pixel circuits for driving the pixels of the electro-optical device, causing at least one of the pixel circuits formed on the first substrate to face the position on a second circuit, used for disposing the pixel circuits, where the pixel circuits are to be disposed, and connecting that pixel circuit to the second substrate, and imparting energy to a part of the release layer where the pixel circuits to be released are provided, and releasing the at least one pixel circuit from the first substrate along with the second substrate.

With this method, the pixel circuits are formed integrated on the first substrate. An integrated pixel circuit can be transferred to the second substrate by causing that pixel circuit to face the position on the second substrate where the pixel circuits are to be disposed, and imparting energy. In other words, pixel circuits can be transferred just to the necessary locations of the relatively large second substrate, so the material can be used in the minimum amount required, and with the minimum amount of release work.

The "first substrate" referred to here is preferably heat resistant enough to withstand the step of forming the pixel circuits. Quartz glass or another such substrate can be used, for example. A substrate that transmits light is preferable from the standpoint of efficiently imparting the energy.

There are no restrictions on the "energy" here, but imparting the energy by optical irradiation, for example, is favorable. Utilizing light allows the energy to be imparted to any area desired, and makes accurate positioning possible, and is therefore advantageous when the circuit being transferred is microscopic in size. There are no particular restrictions on this light, but if laser light is used, for instance, the energy can be imparted more efficiently because the light is coherent, and accurately imparting the energy at the proper location is possible.

The "release layer" referred to here should be formed from a material with which the bonding strength between the substrate and the circuit being transferred will be weakened by imparting energy. Examples of materials that can be used include amorphous silicon, amorphous silicon containing hydrogen, amorphous silicon containing nitrogen, hydrogen-containing alloys, nitrogen-containing alloys, multilayer films, ceramics, metals, and organic macromolecular materials.

The "electro-optical device" referred to here is generally an apparatus equipped with electro-optical elements and having a specific function, such as a display device. For instance, if this is an electro-optical device in which EL elements are used as the electro-optical elements, then the EL elements can be mounted by transfer during the manufacture of the EL elements, without subjecting the light emitting layer or the anti-reflective layer to any heat damage, and the elements obstruct display less than when they are formed between the substrate and the light emitting layer as in the past, so display performance is better.

The connection of the pixel circuits with the second substrate encompasses both electrical connection and physical connection. For instance, rather than the second substrate being the substrate on which pixel circuits and so forth are ultimately provided, there may be an intermediate substrate that temporarily holds the second substrate in order to transfer the pixel circuits again to another substrate.

Further, the present invention may comprise the steps of forming on a first substrate a release layer that releases when subjected to a specific energy, forming on the release layer a scan line drive circuit and/or a data line drive circuit for driving pixel circuits, causing the scan line drive circuit and/or data line drive circuit formed on the first substrate to face the position on a second circuit, used for disposing the pixel circuits, where the scan line drive circuit and/or data line drive circuit is to be disposed, and connecting the scan line drive circuit and/or data line drive circuit to the second substrate, and imparting energy to a part of the release layer where the scan line drive circuit and/or data line drive circuit is provided, and releasing the scan line drive circuit and/or data line drive circuit from the first substrate along with the second substrate.

With this method, the scan line drive circuit and/or data line drive circuit is formed integrated on the first substrate. An integrated drive circuit can be transferred to the second substrate by causing that drive circuit to face the position on the second substrate where the drive circuit is to be disposed. In other words, drive circuits can be transferred just to the necessary locations of the relatively large second substrate, so the material can be used in the minimum amount required, and with the minimum amount of release work.

The scan line drive circuit and/or data line drive circuit here may be formed on the same substrate as the pixel circuits, or on a separate substrate. Also, the step for forming the scan line drive circuit and/or data line drive circuit, the step of connecting with the second substrate, and/or the release step may be carried out simultaneously with the above-mentioned step of forming the pixel circuits, the step of connecting with the second substrate, and/or the release step, or they may be carried out separately. If they are performed separately, the order in which these mutually corresponding steps are carried out may be such that the steps involving the pixel circuits are carried out either before or after the steps involving the scan line drive circuit and/or data line drive circuit.

For example, the step of forming the release layer may be followed by a further step of forming a boundary between one part of the release layer and the other part, for releasing the circuit to be released according to the shape of the circuit to be released, following the step of forming the release layer. When this step is included, a boundary is formed around the released circuit, so release along this boundary is easier, and just the desired circuit can be properly released with minimal effort. The phrase "circuit to be released" here refers to a pixel circuit, a scan line drive circuit, and/or data line drive circuit.

This method may further comprise a step of mutually separating a plurality of circuits formed on the release layer, prior to the step of connecting to the second substrate, for example. When this step is included, the circuits to be released are separated from one another, so just the desired circuit can be properly released with minimal effort. The phrase "plurality of circuits" here refers to a pixel circuit, a scan line drive circuit, and/or data line drive circuit.

The second substrate may, for example, be formed by the steps of forming an electro-optical element in each pixel area, and forming wiring for connecting the electro-optical elements to the pixel circuits. With these steps, electro-optical elements and wiring are formed ahead of time on the second substrate, and the wiring used to drive the electro-optical elements can be completed by transferring the pixel circuits from the first substrate to suitable locations on the second substrate.

The phrase "electro-optical element" here generally refers to an element that emits light or changes the state of light from the outside through electrical action, and encompasses both elements that emit light themselves and elements that control the passage of light from the outside. For instance, electro-optical elements include EL elements, liquid crystal elements, electrophoresis elements, and electron emission elements that emit light by directing electrons generated by the application of an electric field at a light emitting panel.

It is preferable if the above-mentioned electro-optical elements are current drive elements, such as electroluminescence (EL) elements. "Electroluminescence element" generally refers to an element that utilizes the electroluminescence phenomenon, whereby a light emitting substance is made to emit light by rebonding energy in the rebonding of holes injected from an anode with electrons injected from a cathode, by the application of an electrical field, regardless of whether the light emitting substance is organic or inorganic (Zn:S and so on). The layer structure sandwiched by the electrodes of the electroluminescence element may be a light emitting layer composed of a light emitting substance, or may be a hole transport layer or an electron transport layer, or both. Specific examples of layer structures that can be used include cathode/light emitting layer/anode, cathode/light emitting layer/hole transport layer/anode, cathode/electron transport layer/light emitting layer/anode, and cathode/electron transport layer/light emitting layer/hole transport layer/anode.

With the present invention, for example, the second substrate is designed so that to be connectable with a third substrate on which electro-optical elements are formed corresponding to pixels, and the method may further comprise a step of connecting the second substrate to the third substrate, following the release step.

Also, with the present invention, the second substrate may be formed by the steps of forming wiring for connecting the electro-optical elements formed on the third substrate to the pixel circuits on the second substrate, and forming bumps for electrically connecting the wiring with the electro-optical elements formed on the third substrate.

Specifically, there are various possibilities for the relationship between the second substrate and the third substrate. For instance, when an electro-optical device is manufactured by forming wiring and electro-optical elements on the second substrate, and the pixel circuits transferred from the first substrate are transferred to this second substrate, the electro-optical device is manufactured by forming the wiring on the second substrate and the electro-optical elements on the third substrate, and connecting the pixel circuits transferred from the first substrate to the second substrate with the electro-optical elements on the third substrate.

Furthermore, when a scan line drive circuit and/or data line drive circuit is to be transferred, these circuits may be transferred to the second substrate.

Yet another invention is an electro-optical device manufactured by the method for manufacturing an electro-optical device of the present invention.

With this electro-optical device, the scan line drive circuit and data line drive circuit drive the pixel circuits by time division gradation drive method. This is because fewer elements should be needed by the pixel circuits with a time division gradation drive method, so the effect of lowering cost in the present invention is even better. This time division gradation drive method is described in Japanese Patent Application 2001-166730 submitting by the applicant.

In the step of connecting the second substrate and the third substrate, it is preferable if the second substrate and the third substrate are connected in an area of the third substrate where light emission will not be hindered in the pixel area.

This means that no connection structure is provided at a location that would hinder light emission in the pixel area, so a brighter electro-optical device can be obtained.

Further, the third substrate may have formed on it an area for connecting to the second substrate in an area other than the light emitting area of the electro-optical elements. This means that no structure related to connection will block light from the light emission area, so a brighter electro-optical device can be obtained.

It is preferable if each pixel corresponds to one of a plurality of primary colors for producing a color display, and a single color pixel is constituted by a group of the pixels corresponding to the plurality of primary colors.

Yet another invention is an electro-optical device manufactured by the method for manufacturing an electro-optical device of the present invention. There are no restrictions on the "electronic device," but examples include television sets, automobile navigation systems, POS equipment, personal computers, head-mounted displays, rear or front projectors, fax machines with a display function, electronic signs, information panels for transportation vehicles and so forth, game devices, control panels for machinery, electronic books, and portable devices such as digital cameras, portable televisions, DSPs, PDAs, electronic notebooks, cellular telephones, and video cameras.

DESCRIPTION OF THE PREFERRED EMBODIMENTS

Preferred embodiments of the present invention will now be described through reference to the drawings.

Embodiment 1

Embodiment 1 relates to a method for manufacturing a display device in which each of the pixel circuits formed on a substrate are removed and connected to another substrate on which EL elements have been formed in various pixel areas.

Figure 1:
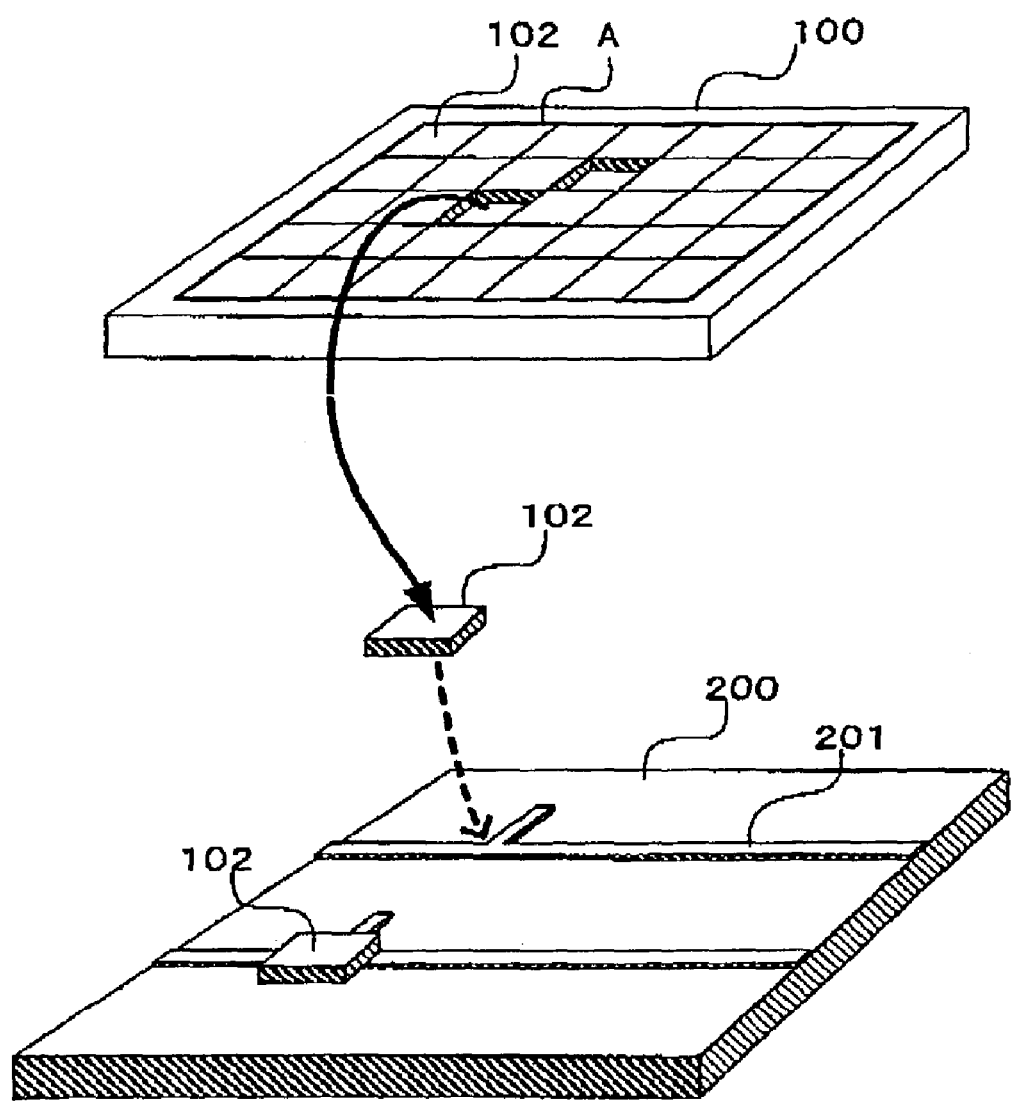
FIG. 1 is a simplified diagram illustrating the method for manufacturing an electro-optical device in the present invention.

FIG. 1 is a conceptual diagram of this embodiment. In the present invention, first, a plurality of pixel circuits 102 are consecutively formed at high density in a pixel circuit formation area A on a substrate 100, via a release layer. Next, the pixel circuits 102 are removed from the substrate 100 and disposed at the original pixel circuit formation locations on a substrate 200, which has been formed separately and on which wiring 201 has been patterned.

Figure 2A:
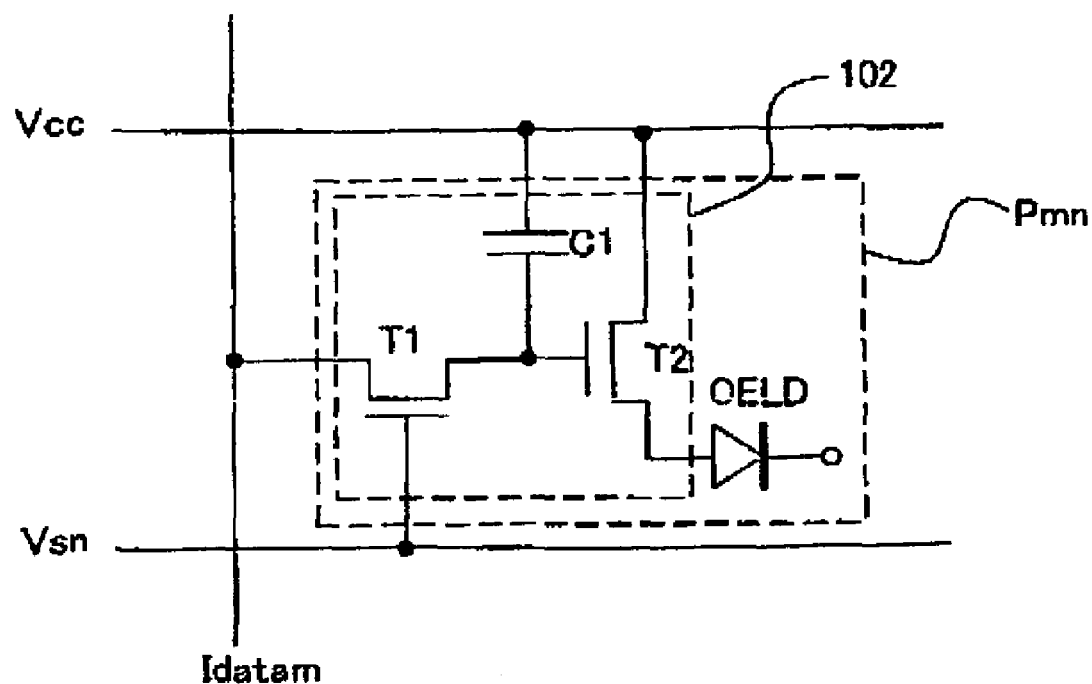
FIG. 2 consists of specific examples of the pixel circuit in Embodiment 1, with FIG. 2A being an example of a pixel circuit for an organic EL element, and FIG. 2B an example of a pixel circuit for a liquid crystal element.
Figure 2B:
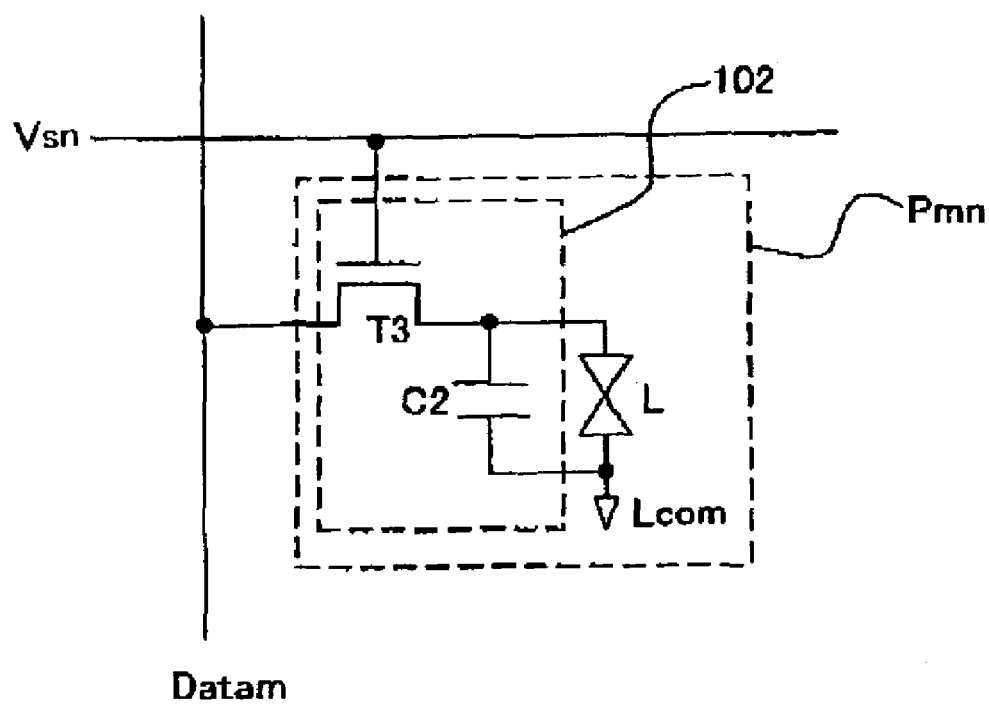

FIG. 2 shows structural examples of circuits suitable as pixel circuits formed in this embodiment. FIG. 2A is an example of a circuit in which an organic EL element OELD is used as an electro-optical device, and FIG. 2B is an example of a circuit in which a liquid crystal element L is used as an electro-optical device.

The circuit shown in FIG. 2A is equipped with transistors T1 and T2 and a capacitor C1 as the pixel circuits 102, and is equipped with an organic EL element OELD as an electro-optical element. In a pixel area Pmn ($1 \leq m \leq M$ (M is the maximum number of data lines); $1 \leq n \leq N$ (N is the maximum number of scanning lines)), a voltage value indicating the digital value supplied according to the time division gradation drive method (that is, a state of either on or off) is outputted to the data line Idatam. If the scanning line (select line) Vsn is selected, the transistor T1 is switched on, and the voltage of the data line is written to the capacitor C1. Whether the transistor T2 is on or off is determined by the on/off state of the data line voltage at this point. If the transistor T2 is off (a digital value of "0"), no current is supplied to the organic EL element OELD and the pixel thereof does not emit light. If, however, the transistor T2 is on (a digital value of "1"), current is supplied to the organic EL element OELD and the pixel thereof emits light. In this manner, according to the time division gradation drive method, the value of the data line is limited to just two states, either on or off, and is unaffected by any variance in the threshold voltage of the transistor T2, so an image of high quality (that is, of accurate gradation) can be displayed with the simple circuit shown in FIG. 2A.

The circuit shown in FIG. 2B is equipped with a transistor T3 and a capacitor C2 as pixel circuits 102. In the pixel area Pmn, a voltage value indicating the digital value supplied according to the time division gradation drive method (that is, a state of either on or off) is outputted to the data line Datam. If the scanning line Vsn is selected, the transistor T3 is driven and voltage corresponding to the on or off state of the data line is supplied to the pixel electrodes of the liquid crystal element L. In other words, the liquid crystal element L is driven according to the digital value state of the data line. Again with this circuit, the data supplied to the data line Datam is on/off digital data, and is driven in the saturated area of the transistor T3 and unaffected by the threshold voltage thereof, so an image of high quality (that is, of accurate gradation) can be displayed.

The circuits shown in FIGS. 2A and 2B both have few TFT elements, and the surface area taken up when the pixel circuits are formed is small. When the present invention is applied to the manufacture of such pixel circuits, many of these circuits can be formed all at once, in high density, on a dedicated substrate for forming a semiconductor, which greatly reduces the manufacturing cost.

Figure 3:
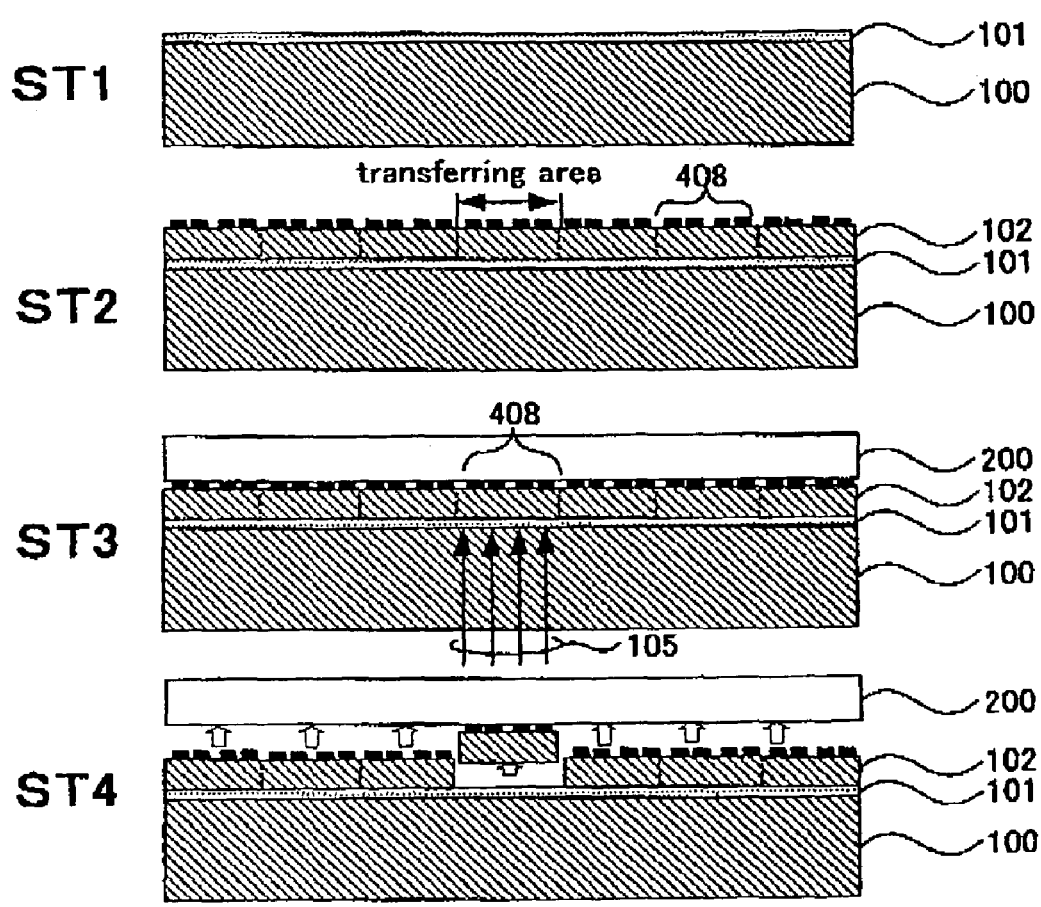
FIG. 3 consists of manufacturing step cross sections illustrating the method for manufacturing a display device in Embodiment 1.

FIG. 3 consists of manufacturing step cross sections illustrating the method for manufacturing a display device in Embodiment 1.

First, a release layer 101 for releasing when subjected to energy is formed on a substrate 100 (ST1). The substrate 100 is preferably made from a highly reliable material, and it is particularly favorable for it to be made from a material with excellent heat resistance. The reason for this is that in the formation of the pixel circuits 102, the process temperature can sometimes be quite high (about 350 to 1000° C., for example) depending on the type of circuits and how they are formed, but as long as the substrate 100 has excellent heat resistance, there will be ample latitude in setting the film formation conditions. This makes possible the desired high-temperature treatment in the manufacture of numerous elements or circuits on the substrate 100, and allows elements or circuits with high reliability and performance to be manufactured. Therefore, if we let Tmax be the maximum temperature in the formation of the pixel circuits 102, it is preferable for the substrate 100 to be made from a material with a distortion point of at least Tmax. More specifically, it is preferable for the substrate 100 to be made of a material with a distortion point of at least 350° C., and even more preferably at least 500° C. Examples of such materials include quartz glass, Corning 7059, Nippon Electric Glass OA-2, and other such heat resistant glass materials.

When subjected to a specific energy by laser irradiation (optical irradiation), heating, or the like, the release layer 101 undergoes a decrease in the bonding strength between its atoms or molecules, or generates gas and undergoes a decrease in bonding strength, resulting in release. The release layer 101 consists of one or more layers, and can be designed so that release occurs at the boundary of the release layer 101 or inside the release layer. Amorphous silicon containing hydrogen and formed by CVD, for example, can be used as the material for the release layer, but other materials can also be used, such as a metal layer.

The following are specific examples of the release layer composition.

1) Amorphous silicon (a-Si)

This amorphous silicon may contain hydrogen (H). The hydrogen content should be about 2 at % or higher, and 2 to 20 at % is even better. If hydrogen is contained, internal pressure will be generated in the release layer when the hydrogen is set free by optical irradiation, and this pressure promotes release. The hydrogen content can be appropriately adjusted by varying the film formation conditions. For instance, when CVD is employed, conditions that can be varied include the gas composition, gas pressure, gas atmosphere, gas flux, gas temperature, substrate temperature, and optical power used.

2) Silicon oxide or silicic acid compound, titanium oxide or titanic acid compound, zirconium oxide or zirconic acid compound, lanthanum oxide or lanthanic acid compound, and various other such oxide ceramics, dielectrics, and semiconductors Examples of silicon oxide include $SiO$, $SiO_2$, and $Si_3O_2$. Examples of silicic acid compounds include $K_2Si_3$, $Li_2SiO_3$, $CaSiO_3$, $ZrSiO_4$, and $Na_2SO_3$.

Examples of titanium oxide include $TiO$, $Ti_2O_3$, and $TiO_2$. Examples of titanic acid compounds include $BaTiO_4$, $BaTiO_3$, $Ba_2Ti_9O_{20}$, $BaTi_5O_{11}$, $CaTiO_3$, $SrTiO_3$, $PbTi_3$, $MgTiO_3$, $ZrTi_2$, $SnTiO_4$, $Al_2Ti_5$, and $FeTiO_3$.

Examples of zirconium oxide include $ZrO_2$. Examples of zirconic acid compounds include $BaZrO_3$, $ZrSiO_4$, $PbZrO_3$, $MgZrO_3$, and $K_2ZrO_3$.

3) Silicon nitride, aluminum nitride, titanium nitride, and other such nitride ceramics 4) Organic macromolecular materials These organic macromolecular materials can be compounds having —$CH_2$—, —CO— (ketone), —CONH— (amido), —NH— (imide), —COO— (ester), —N=N— (azo), —CH=N— (Schiff), and other such bonds (these interatomic bonds are broken by optical irradiation), but any other composition may also be used as long as it includes many of these bonds.

The organic macromolecular material may be one whose structure includes an aromatic hydrocarbon (one or more benzene rings or a condensed ring thereof). Specific examples of such organic macromolecular materials include polyethylene, polypropylene, and other polyolefins, polyimide, polyamide, polyester, polymethyl methacrylate (PMMA), polyphenylene sulfide (PPS), polyether sulfone (PES), and epoxy resin.

5) Metals

Examples of metals include Al, Li, Ti, Mn, In, Sn, Y, La, Ce, Nd, Pr, Gd, and Sm, as well as alloys including at least one of these.

The thickness of the release layer 101 should be about 1 nm to 20 µm, with a range of about 10 nm to 2 µm being preferable, and about 40 nm to 1 µm being even better. If the release layer is too thin, the thickness uniformity of the resulting film may be lost and release will be uneven, but if the release layer is too thick, the power (quantity) of irradiating light needed for release will have to be increased, or it will take longer to remove the residue of the release layer left behind after release.

The method for forming the release layer should be one that allows the release layer to be formed in a uniform thickness, and can be appropriately selected as dictated by the composition and thickness of the release layer and other such factors. Examples include CVD (including MOCCVD, low pressure CVD, and ECR-CVD), vapor deposition, molecular beam vapor deposition (MB), sputtering, ion plating, PVD, and various other vapor phase film formation methods, electroplating, dip plating (dipping), electroless plating, and various other plating methods, the Langmuir-Blodgett (LB) method, spin coating, spray coating, roll coating, and other coating methods, various printing methods, transfer, ink jet printing, and powder jet methods. A combination of two or more of these methods may also be used.

Particularly when the release layer is made up of amorphous silicon (a-Si), it is preferable to form the film by CVD, and especially by low pressure CVD or plasma CVD. When the release layer is formed by film formation using a ceramic in a sol-gel process, or when it is made up of an organic macromolecular material, it is preferable to form the film by a coating method, and particularly spin coating.

The method for manufacturing the substrate 100 or the release layer 101, and alternate materials that can be used, are discussed in detail in Japanese Laid-Open Patent Applications H10-125930 and H10-125931, for example.

After the release layer 101 has been formed, an element formation layer equipped with a plurality of pixel circuits 102 for driving the various pixels of the display device is formed (ST2). A known process for forming semiconductor thin film elements can be applied, with various modifications thereto, in forming the pixel circuits 102, but a method for forming polycrystalline thin film transistors with a laser will be described here through reference to FIG. 4.

Figure 4:
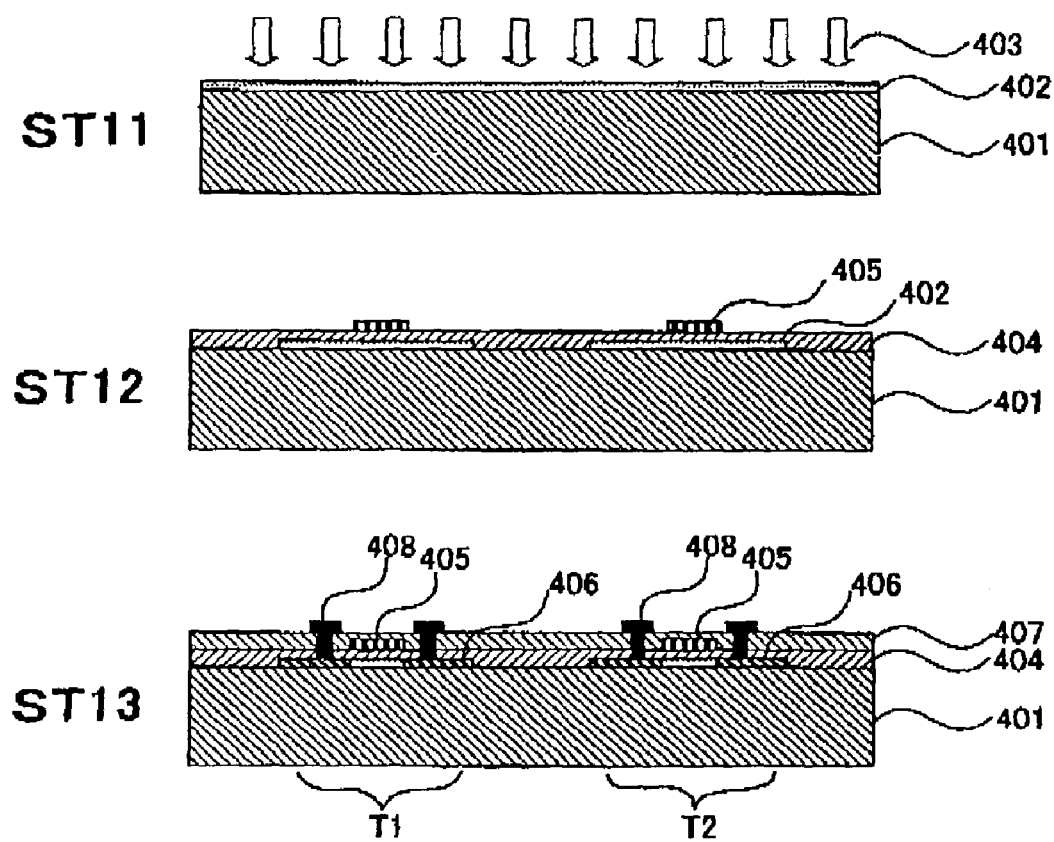
FIG. 4 consists of detail manufacturing step cross sections of the pixel circuit.

FIG. 4 consists of enlarged manufacturing step cross sections of a pixel circuit 102. First, $SiH_4$ is applied by PECVD over the release layer 101, or $Si_2H_6$ is applied by LPCVD, to form an amorphous silicon film 401. Next, the surface is crystallized by being irradiated with a laser 403, which forms a polycrystalline silicon film 402 (ST11). The polycrystalline silicon film 402 is then patterned by a standard method in the shape of the semiconductor area of the transistor T1 or T2, after which an insulating film 404 is formed, and a metal layer is then patterned to form a gate electrode 405 (ST12). Next, an impurity such as phosphorus or boron is introduced into the polycrystalline silicon film 402 to form a self-aligned drain area and source area 406. An interlayer insulating film 407 is then formed, a contact hole is formed over the source area and drain area, and a source electrode and drain electrode 408 are formed.

In addition to forming a plurality of integrated circuits having the same function in the element formation layer, a plurality of integrated circuits having a different function can also be formed, or a plurality of different types of integrated circuits can each be formed. A known method, such as that described in Japanese Patent Publication H2-50630, can be used for the manufacturing process of this thin film transistor and so forth.

The above pixel circuit formation step forms an element formation layer in which numerous pixel circuits 102 such as those shown in FIG. 2A or 2B, including TFTs, wiring, capacitors, and so on, over the release layer 101 (FIG. 3, ST2).

Furthermore, in FIG. 3, one of the pixel circuits 102 formed in the above-mentioned step is made to face the position on a substrate 200 (used for disposing the pixel circuits 102) where these pixel circuits are to be disposed, and that pixel circuit 102 is electrically connected with the relay substrate 200 (ST3). A standard electrical connection method, such as soldering, is applied for this connection.

Figure 5A:
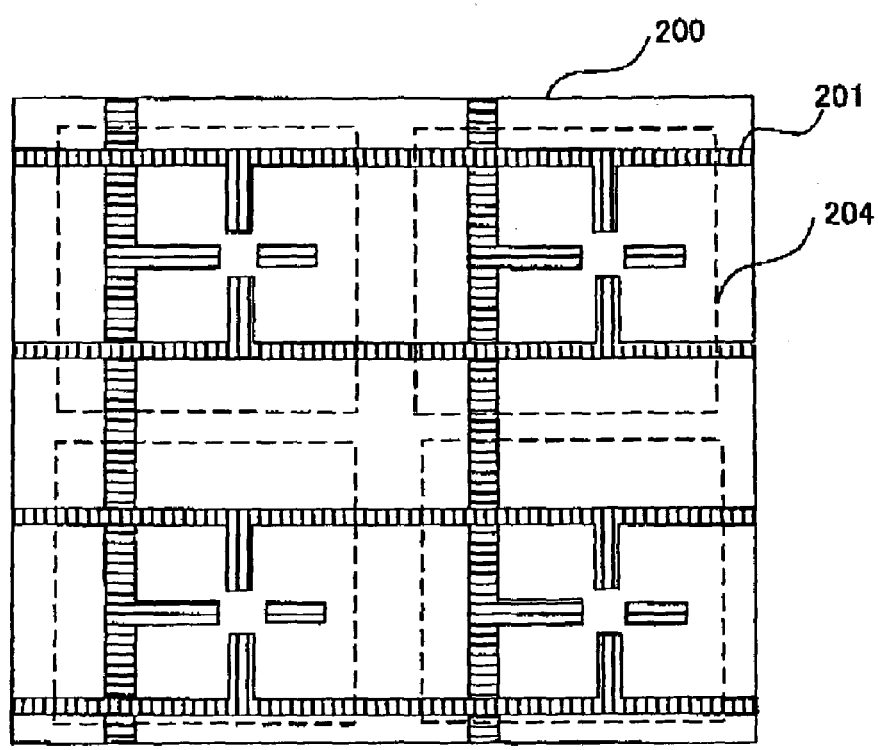
FIG. 5 consists of simplified diagrams of relay substrates, with FIG. 5A being the wiring pattern on the side where the pixel circuits are connected, and FIG. 5B the wiring pattern on the side where the electro-optical element substrate is connected.
Figure 5B:
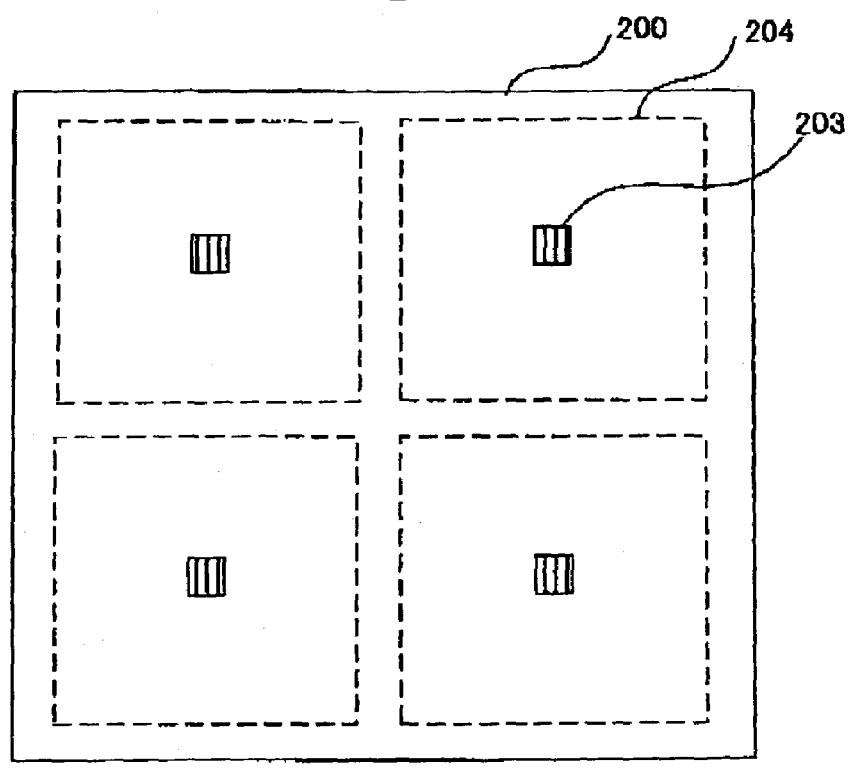

FIG. 5 shows an example of the relay substrate 200 to which the pixel circuits 102 are ultimately transferred. This relay substrate 200 is a kind of intermediate connection substrate, used for connecting to a separately provided electro-optical element substrate 300 (see FIG. 7) after the pixel circuits 102 have been transferred.

The relay substrate 200 here may be flat or curved. Also, compared to the substrate 100, the relay substrate 200 may have inferior heat resistance, corrosion resistance, and so forth. The reason for this is that with the present invention, the pixel circuits 102 are formed on the substrate 100 side, after which the pixel circuits are transferred to the relay substrate 200, so the characteristics required of the relay substrate 200, and particularly its heat resistance, are not dependent on the temperature and other conditions in the formation of the pixel circuits 102.

Therefore, if we let Tmax be the maximum temperature in the formation of the pixel circuits 102, the material from which the relay substrate 200 is made can be one whose glass transition temperature (Tg) or softening point is no more than Tmax. For instance, the final substrate 14 can be made of a material whose glass transition temperature (Tg) or softening point is preferably 800° C. or lower, and even more preferably 500° C. or lower, and more preferably still 320° C. or lower.

Wiring 201 for the power supply lines, scanning lines, data lines, and so forth in a display device is provided on one side of this relay substrate 200. Each set of wiring 201 is patterned around a pixel circuit area 204 that connects the pixel circuits 102, so as to allow the connection of electrodes 408 provided to the pixel circuits 102. In addition to this wiring, scan line drive circuits or data line drive circuits (see FIG. 12) for driving the pixel circuits may be formed as necessary. Bumps 203 for connecting to the cathodes 305 of the electro-optical elements 310 provided to the electro-optical element substrate 300 are formed on the other side of the relay substrate 200. The bumps 203 on the back of the substrate 200 are connected with the wiring 201 on the front by through holes 202 (see FIG. 7).

In order to manufacture this relay substrate 200, first, the wiring 201 is formed for connecting the pixel circuits 102 with the electro-optical elements 310 provided to the electro-optical element substrate 300. In this step, known technology is used to form the through holes 202 at the position where the electro-optical elements are to be connected on the main part of the substrate, which is formed from silicon or the like. On the front side (the side where the pixel circuits are connected) is formed a wiring pattern that will serve as the scanning lines, power supply lines, and data lines in the display area, utilizing standard photolithographic technology and thin film technology. On the back side (the side connected with the electro-optical element substrate) are formed the bumps 203 for electrically connecting to the cathodes 305 of the electro-optical elements 310. Since the bumps 203 are connected to the electro-optical elements over a small surface area, they are preferably formed from a material such as a gold (Au) that has low contact resistance and whose surface is resistant to oxidation. The bumps may also be formed after the formation of a metal layer for improving the contact between the bumps 203 and the through holes 202.

In step ST3 in FIG. 3, after the pixel circuits 102 have been electrically connected to the relay substrate 200, energy is imparted to the portion of the release layer 101 provided with the pixel circuits 102 to be released, and these pixel circuits 102 are released from the substrate 100 along with the relay substrate 200.

Any irradiation light can be used as long as it will bring about internal and/or interfacial release in the release layer, but examples of light that can be used include X-rays, ultraviolet rays, visible light, infrared rays (thermal rays), laser light, milliwaves, microwaves, and light of various other wavelengths. It is also possible to use an electron beam, radiation (alpha rays, beta rays, gamma rays), or the like. Of these, laser light is especially good because it lends itself well to ablation of the release layer. This irradiation with light is preferably performed such that the irradiation intensity is uniform in the irradiated area.

Examples of laser apparatus for generating this laser light include various types of gas laser and solid laser (semiconductor laser), but excimer lasers, Nd-YAG lasers, argon lasers, $CO_2$ lasers, CO lasers, He—Ne lasers, and so forth are particularly favorable, of which an excimer laser is the best. An excimer laser outputs high energy in a short wavelength band, so the release layer can be ablated in an extremely short time. Accordingly, almost no temperature elevation is brought about in the adjacent or nearby layers, and release can be achieved while layer deterioration and damage are kept to a minimum.

If ablation of the release layer 101 is wavelength-dependent, then the wavelength of the irradiating laser light should be about 100 to 350 nm. For the release layer to undergo a layer change such as gas emission, vaporization, or sublimation, the wavelength of the irradiating laser light should be about 350 to 1200 nm.

If an excimer laser is used, the energy density of the irradiating laser light should be about 10 to 5000 mJ/cm$^2$, and preferably about 100 to 5299 mJ/cm$^2$. A duration of about 1 to 1000 nsec is preferable, and about 10 to 100 nsec is even better. Ablation will be insufficient if either the energy density is too low or the irradiation time too short, but if the energy density is too high or the irradiation time too long, irradiating light that passes through the release layer or an intermediate layer may have an adverse effect on the layer to be transferred.

Figure 6:
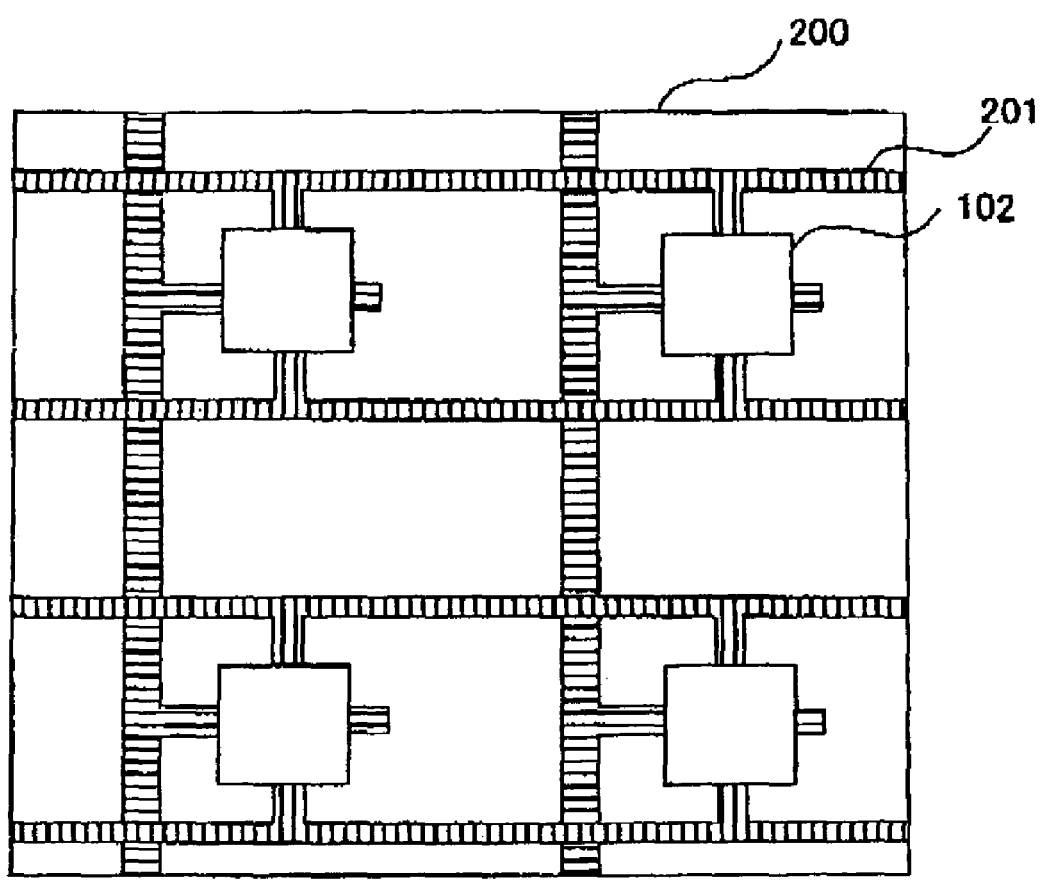
FIG. 6 is a plan view of the relay substrate after the pixel circuits have been connected.

FIG. 6 is a plan view of the relay substrate after all of the required pixel circuits 102 have been released and connection on the relay substrate 200 has been completed. As shown in FIG. 6, the pixel circuits can be disposed over a relatively broad area.

In FIG. 3, after the pixel circuits 102 have been released from the substrate 100, the relay substrate 200 is connected with the electro-optical element substrate 300 (ST4).

Figure 7:
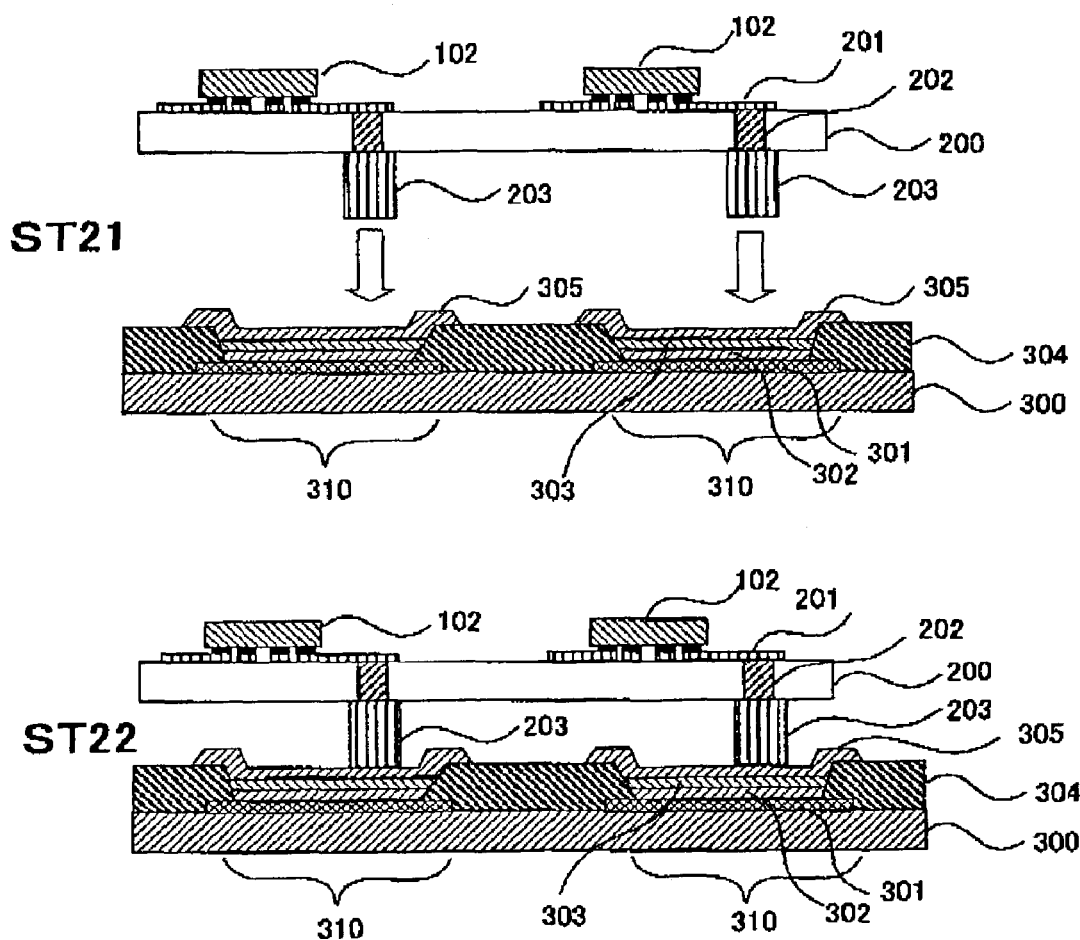
FIG. 7 consists of enlarged detail cross sections of the step of connecting the electro-optical element substrate and the pixel circuits.

FIG. 7 consists of detail cross sections of the step of connecting the relay substrate 200 and the electro-optical element substrate 300. FIG. 7 illustrates how each pixel circuit 102 is connected to the corresponding organic EL element 310 (electro-optical element).

The electro-optical element substrate 300 is formed ahead of time. A variety of known methods for manufacturing organic EL elements can be employed here in the manufacture of the electro-optical element substrate 300. The following is an example of using an ink jet method.

First, a film is formed from a known material such as ITO to produce a transparent electrode 301 on a substrate 300 made from quartz or glass. A bank 304 is then formed using a material such as polyimide or acrylic, and the area corresponding to the light emitting portion of the electro-optical element to be formed is opened up. Next, the affinity between the substrate surface and the transparent electrode surface is adjusted by plasma treatment using an oxygen plasma, $CF_4$ plasma, or the like, after which a hole injection layer 302 and a light emitting layer 303 are formed by spin coating, squeegee coating, an ink jet process, or another such liquid layer process, or by sputtering, vapor deposition, or another such vacuum process. A cathode 305 containing an alkali metal is formed in order to reduce the work function, and this is sealed with a sealing material as needed, which completes the electro-optical element substrate 300. Even if a sealing material is used, the portion of the relay substrate 200 where the bumps 203 are connected is left open. This ink jet process is described in detail by Shimoda et al. in Techn. Dig. JEDM 1999, p.289, and by Kanbe et al. in Proc. Euro. Display '99 Late-News Papers, 85.

In ST21 in FIG. 7, the electro-optical element substrate 300 is moved toward the side of the relay substrate 200 (on which the pixel circuits 102 have already been transferred to the positions corresponding to the appropriate pixel areas) where the bumps 203 have been formed. The bumps 203 of the relay substrate 200 at this time are positioned so as to correspond to the cathodes 305 formed on the uppermost layer of the light emitting portion of the electro-optical element substrate 300.

In ST22 in FIG. 7, the bumps 203 are electrically connected with the cathodes 305. This electrical connection can be accomplished as appropriate by a known method that allows these components to be connected at low resistance and with a certain amount of mechanical strength, such as press bonding, hot press bonding, vapor deposition, or fusion. After this, if needed, an insulating film is formed between the relay substrate 200 and the electro-optical element substrate 300, or a sealing structure is formed around these two substrates to seal them. An example of a sealing method will be described in specific terms in Embodiment 3.

In the above steps, pixel circuits were transferred to a relay substrate, and this relay substrate was then connected to an electro-optical element substrate, but an alternative is to form the electro-optical elements 310 in the various pixel areas 204 ahead of time, and connect the electro-optical elements 310 with the pixel circuits 102 formed directly on the substrate 100. Specifically, in this case there is no need for the electro-optical element substrate 300.

The effect of Embodiment 1 above is that the pixel circuits are first formed at high density and then disposed corresponding to the positions of the electro-optical elements, so a display device can be manufactured at a lower cost reflecting the fewer elements required in the pixel circuits.

More specifically, with this Embodiment 1, the pixel circuits to be transferred do not have to be individually diced into chips, which simplifies the manufacturing process and reduces the amount of material and labor entailed, so the cost is lower, and this method is favorable for the mass production of a single product. Also, after all of the chips have been transferred, the transparent substrate can be reused, so there is no waste.

In particular, with Embodiment 1, since the pixel circuits are connected to a relay substrate and then an electro-optical element substrate is connected, all that is needed to complete a display device is two iterations of a relatively simple step in which just the protruding electrode portions are electrically connected to the substrate on the other side, so this method is both simple and offers high reliability.

In particular, with Embodiment 1, a large-surface area electro-optical device can be provided by connecting the relay substrate 200 with the electro-optical element substrate 300 and connecting a plurality of the resulting pairs of substrates in the planar direction. Since connection between a plurality of substrates can be accomplished relatively easily by connecting the wiring of the relay substrates, it is preferable for the substrates to be connected via the relay substrates.

Embodiment 2

Like Embodiment 1, this Embodiment 2 relates to a method for manufacturing a display device in which each of the pixel circuits formed on a substrate are removed and connected to another substrate on which EL elements have been formed in various pixel areas, but this is a variation on Embodiment 1 in that the pixel circuits can be removed with particular ease.

Figure 8:
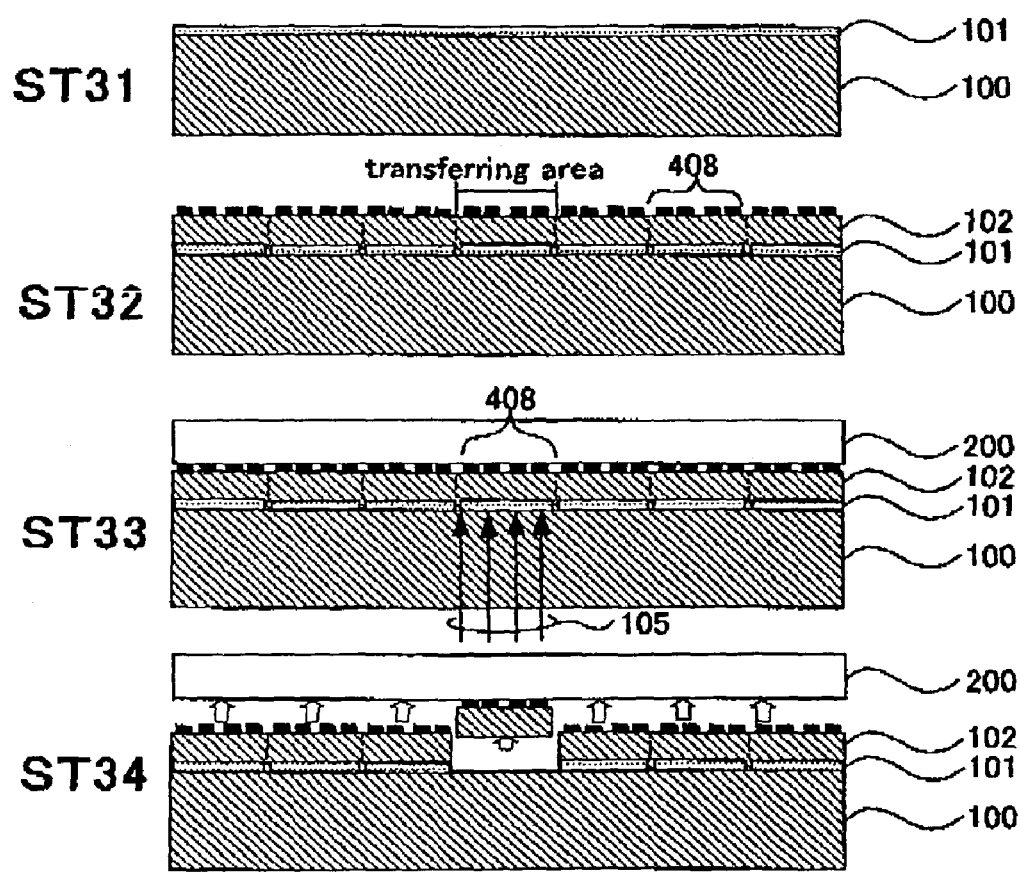
FIG. 8 consists of manufacturing step cross sections illustrating the method for manufacturing a display device in Embodiment 2.

FIG. 8 consists of manufacturing step cross sections of this Embodiment 2. In FIG. 8, those portions corresponding to FIG. 3 are numbered the same and will not be described again.

The step of forming the release layer 101 on the substrate 100 (ST31) is the same as in Embodiment 1.

After the release layer 101 has been formed, a boundary is formed between one part of the release layer 101, which is used for releasing the pixel circuits, and the other part according to the shape of the pixel circuits 102, prior to the formation of the pixel circuits (ST32). More specifically, the release layer 101 is scored in advance by photoetching in a checkerboard or grid pattern, for example, so that the areas of the pixel circuits to be transferred will break off cleanly from the element separation layer 101 around their outer peripheries. Doing this makes it easier to release the individual pixel circuits 102 one by one.

Release can be further facilitated by cutting apart the entire element formation layer, rather than just the release layer. Specifically, after the step of forming the pixel circuits, another step may be added in which a plurality of pixel circuits 102 formed on the release layer 101 are separated from one another. Standard semiconductor wafer cutting technology can be used for separating these pixel circuits. For example, a groove that will serve as a recess structure is formed by photoetching around the outside of the to-be-transferred areas corresponding to the pixel circuits 102. This groove cuts through part of the release layer 101 and all of the element formation layer in the thickness direction of the substrate. This cut may be shallower if just the element formation layer is to be cut. The to-be-transferred areas of the cut element formation layer are released from the other portion of the thin film formation layer with relative ease.

Everything after the release step is the same as in Embodiment 1 above, and will therefore not be described again (ST33 and ST34 in FIG. 8).

In addition to providing the same effect as Embodiment 1, Embodiment 2 also involves cutting the element formation layer ahead of time, so the breakage of the element formation layer in the course of release does not extend to the adjacent non-transfer areas. Also, making cuts in the film thickness direction in advance allows the element formation layer to be removed easily even if the electrical connection between the pixel circuits 102 and the relay substrate 200 does not have good adhesive strength. Furthermore, since the areas to be transferred can be easily discerned, it is easier to position the components during transfer between substrates.

Embodiment 3

Embodiment 3 is a variation on Embodiment 1, in which a connection method for increasing light emission efficiency is employed in the connection of the relay substrate 200 and the electro-optical element substrate 300 in Embodiment 1.

In Embodiment 1 above, the bumps 203 of the relay substrate 200 were connected to the light emitting portion of the electro-optical element substrate 300. In contrast, in Embodiment 3, the cathodes of the electro-optical element substrate 300 are extended to the outside of the light emitting portion, and the bumps are connected in an area other than the light emitting portion.

Figure 9:
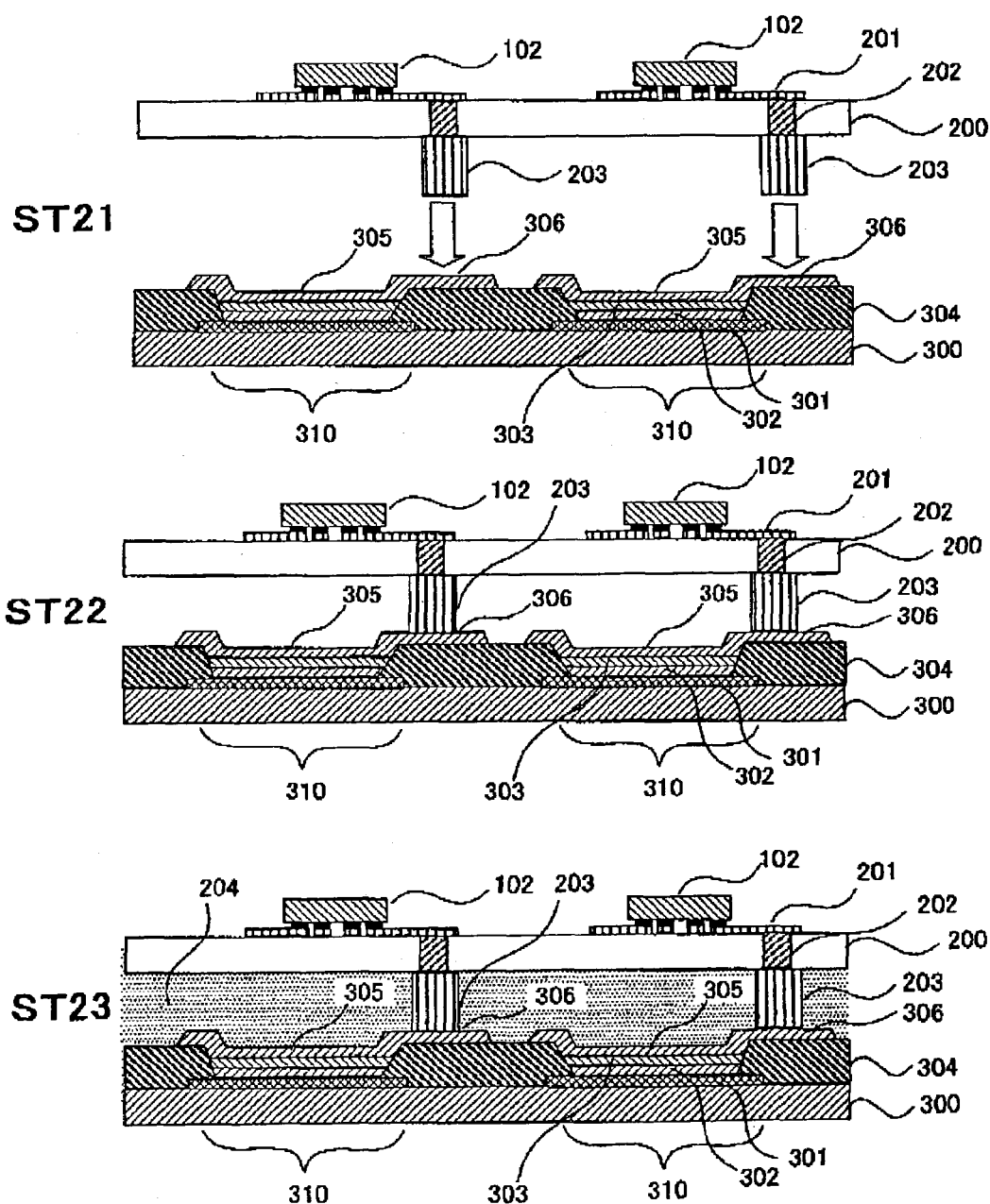
FIG. 9 consists of manufacturing step cross sections illustrating the method for manufacturing a display device in Embodiment 3.

Specifically, as shown in ST21 in FIG. 9, connection areas 306 in which the cathodes 305 of the electro-optical elements extend to the outside of the light emitting areas are formed in advance on the electro-optical element substrate 300. To this end, the banks 304 themselves are formed in a shape that also encompasses these connection areas 306. Those components that are the same as in Embodiment 1 are numbered the same and will not be described again.

Next, as shown in ST22 in FIG. 9, the bumps 203 formed on the relay substrate 200 are positioned so as to be in contact with the connection areas 306 of the electro-optical element substrate 300, and the two are electrically connected. This electrical connection can be accomplished as appropriate by a known method that allows these components to be connected at low resistance and with a certain amount of mechanical strength, such as press bonding, hot press bonding, vapor deposition, or fusion.

At this point in this embodiment, as shown in ST23 in FIG. 9, the space between the connected relay substrate 200 and electro-optical element substrate 300 is sealed. The insulating film 204 is used as the sealing material here. This should be a material with sufficiently high electrical resistance, and one that seals well enough to prevent the oxidation of the cathodes 305. For example, in addition to silicon oxide and silicon nitride, which are standard insulating film materials, various types of resin can also be utilized. If a resin is used, it can be injected into the relatively tight space between the substrates and then cured, affording a more secure bond between the substrates.

The resin used for this sealing material can be either a thermoplastic resin or a thermosetting resin, examples of which include polyethylene, polypropylene, ethylene-propylene copolymers, ethylene-vinyl acetate copolymers (EVA), and other such polyolefins, cyclic polyolefins, modified polyolefins, polyvinyl chloride, polyvinylidene chloride, polystyrene, polyamide, polyimide, polyamide-imide, polycarbonate, poly(4-methylpentene-1), ionomers, acrylic resins, polymethyl methacrylate, acrylic-styrene copolymers (AS resins), butadiene-styrene copolymers, polyol copolymers (EVOH), polyethylene terephthalate (PET), polybutylene terephthalate (PBT), polycyclohexane terephthalate (PCT), and other such polyesters, polyether, polyether ketone (PEK), polyether ether ketone (PEEK), polyether imide, polyacetal (POM), polyphenylene oxide, modified polyphenylene oxide, polyallylate, aromatic polyester (liquid crystal polymers), polytetrafluoroethylene, polyvinylidene fluoride, and other fluororesins, various thermoplastic elastomers such as those based on styrene, polyolefins, polyvinyl chloride, polyurethane, fluororubbers, chlorinated polyethylene, or the like, epoxy resin, phenol resin, urea resin, melamine resin, unsaturated polyester, silicone resin, and polyurethane, as well as copolymers, blends, polymer alloys, and so forth having these as their main components. These can be used singly or in combinations of two or more types (such as a laminate of two or more layers).

Figure 10:
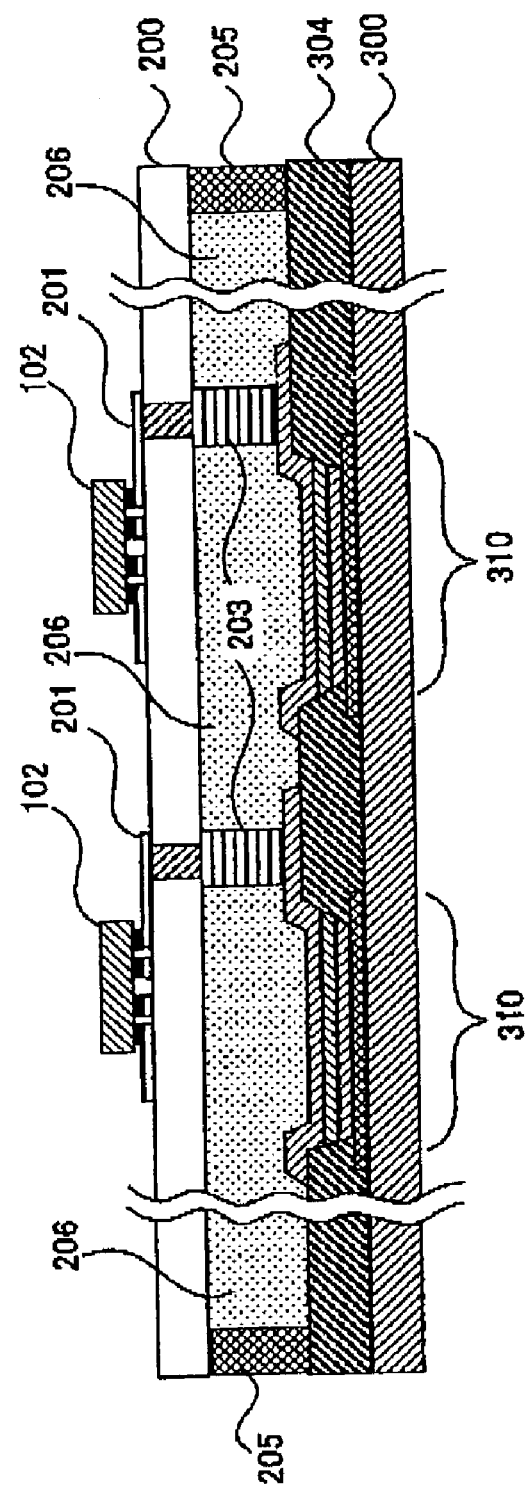
FIG. 10 is a manufacturing step cross section illustrating the sealing step for the display device of Embodiment 3.

In addition to sealing between the relay substrate 200 and the electro-optical element substrate 300 with an insulating film, this space may also be filled with an inert gas. Specifically, as shown in FIG. 10, after the relay substrate 200 and the electro-optical element substrate 300 have been electrically connected, the ends thereof are sealed off with a sealing member 205 and the space between the substrates is filled with an inert gas 206. The sealing means can be any ordinary sealing method such as sealing with a resin, packing, or rubber. Helium, neon, argon, krypton, xenon, or another such commonly used gas can be used as the inert gas 206.

In addition to providing the same effect as Embodiment 1, Embodiment 3 also involves electrically connecting to the relay substrate 200 away from the light emitting portion of the electro-optical elements 310, so light from the light emitting portions is not blocked and high light emission efficiency can be maintained.

Also, with Embodiment 3, the space between the relay substrate 200 and the electro-optical element substrate 300 is sealed with an insulating film or filled with an inert gas, so even if a material that is prone to oxidation is used for the cathodes 305, it will still be possible to obtain an electro-optical device with good durability, in which the oxidation of the cathodes is prevented.

Embodiment 4

Embodiment 4 is a variation on the way the pixels are disposed on the relay substrate 200 in Embodiment 1.

Figure 11:
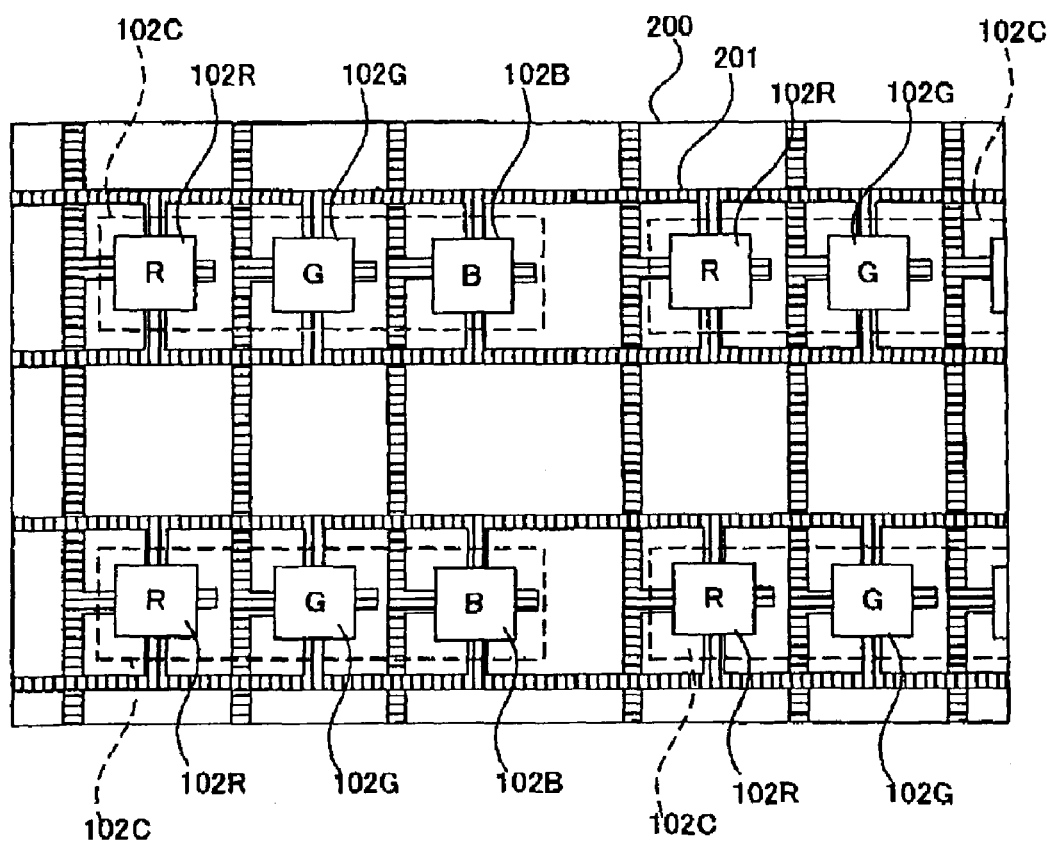
FIG. 11 is a plan view of a relay substrate, the units of which are the color pixel circuits of Embodiment 4.

In Embodiment 1 above, the pixel circuits were independent of one another, but this Embodiment 4 differs in that one color pixel is made up of a plurality of primary colors. Specifically, as shown in FIG. 11, a single color pixel circuit 102C is formed on the relay substrate 200 by three pixel circuits comprising a red (R) pixel circuit 102R, a green (G) pixel circuit 102G, and a blue (B) pixel circuit 102B.

Therefore, in this embodiment, the transfer of the pixel circuits from the substrate 100 to the relay substrate 200 is performed in units of the color pixel circuits 102C consisting of these three primary-color pixel circuits 102R, G, and B. Also, the electro-optical element substrate 300 (not shown) connected to the relay substrate 200 is constituted so as to correspond to red, green, and blue light emission (for example, a color filter of each primary color is provided to the light emitting surface of the light emitting portion), and the electrical connection is made so that the allotment of colors of the pixel circuits 102 coincides with the allotment of colors of the electro-optical elements.

The rest of the structure and steps are the same as in Embodiment 1 above and will not be described again.

In addition to providing the same effect as Embodiment 1, Embodiment 4 also involves transferring in units of color pixel circuits, which allows an electro-optical device to be manufactured that is suited to color display. Specifically, a larger surface area can be achieved in a color display device.

Embodiment 5

Embodiment 5 relates to an electro-optical device that comprises the display device manufactured in Embodiments 1 to 4, and to an electronic device comprising this electro-optical device.

Figure 12:
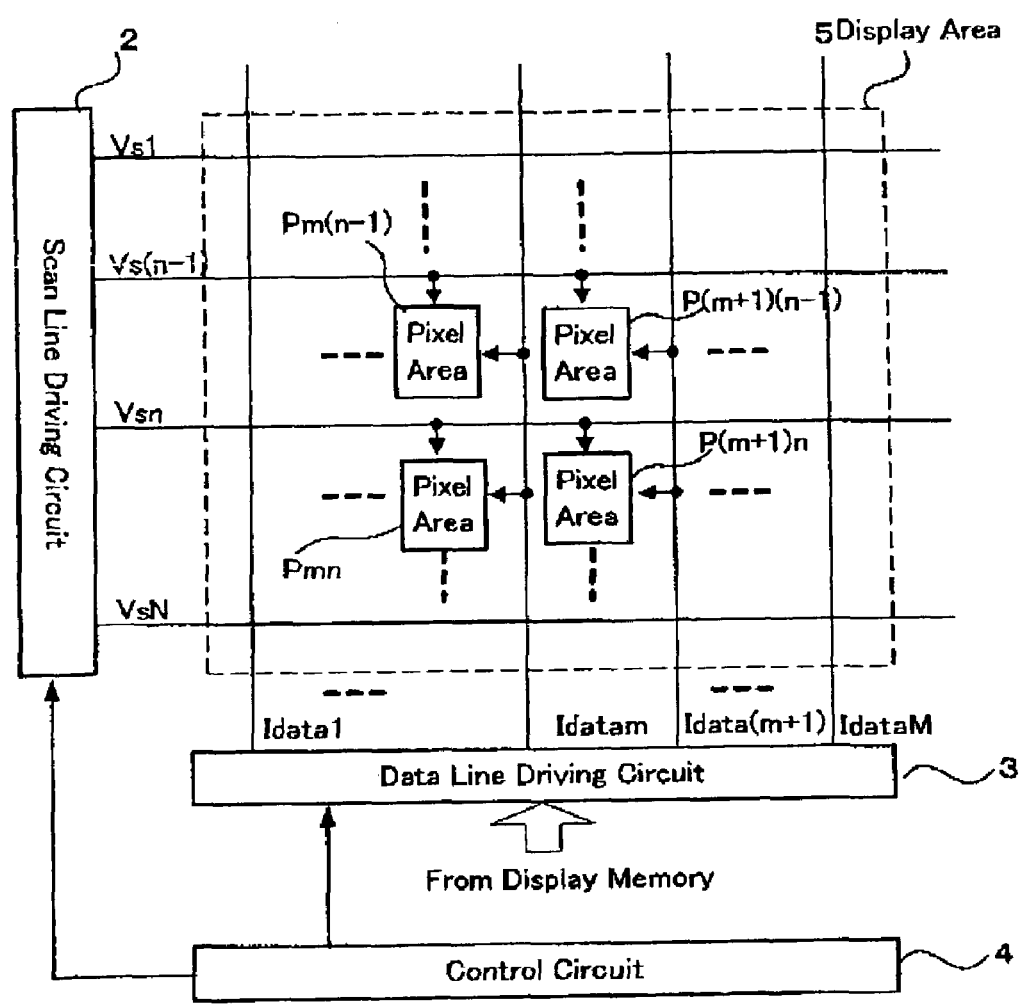
FIG. 12 is a block diagram of the display device in Embodiment 5.

FIG. 12 is a block diagram of the display device 1 in this embodiment, and the peripheral circuitry thereof. This display device is an example of using the pixel circuits 102 shown in FIG. 2A, which make use of organic EL elements, as the electro-optical elements.

As shown in FIG. 12, in the display device 1, a scanning line Vsn extends horizontally in a display area 5, and a data line Idatam extends vertically in the display area 5. A power supply line Vcc is not shown. Pixel areas Pmn are disposed near the intersection of the scanning line Vsn and the data line Idatam. As described in Embodiment 1, the pixel circuits 102 and the organic EL elements OELD are disposed in the various pixel areas Pmn. Each scanning line Vsn is connected to a scan line drive circuit 2, and is supplied with a scanning signal. Each data line Idatam is connected to a data line drive circuit 3, and is supplied with digital data according to a time division gradation drive method. The signal transmission timing of the scan line drive circuit 2 and the data line drive circuit 3 is controlled by a control circuit 4.

The scan line drive circuit 2 here can be, for example, a shift register, or it can be a decoder.

According to the manufacturing methods in Embodiments 1 to 4, the display device 1 is manufactured by connecting the pixel circuits 102 by transfer to the relay substrate 200, forming the organic EL elements OELD on the electro-optical element substrate 300, and electrically connecting the relay substrate 200 to the electro-optical element substrate 300. The organic EL elements OELD end up being provided to the electro-optical element substrate 300 at this point. The pixel circuits 102 here may also be in units of the color pixel circuits 102C just as in Embodiment 4.

The scan line drive circuit 2 and data line drive circuit 3 may be formed separately from the pixel circuits 102 on a second substrate (the relay substrate 200) onto which the pixel circuits are to be transferred, or they may be formed on the substrate (the substrate 100) that serves as the transfer origin and on which the pixel circuits are formed, in the same step as the manufacture of the pixel circuits, or in another step, and then transferred to the relay substrate just as the pixel circuits are.

The control circuit 4 of this display device supplies, in time division, 4-bit dcba digital data to the data line drive circuit 3 at a timing based on time division gradation drive, and transmits a scanning signal to the scan line drive circuit 2 in units of sub-field periods produced by the time division of field periods. Specifically, with this display device, a scanning line Vsn is selected for each binary load, and the length of the light emission period (on period) of the organic EL element is varied, which displays an intermediate gradation of an image.

The control circuit 4 need not be provided on the substrate on which the pixel circuits, scan line drive circuit, and data line drive circuit are formed, and may instead be an external circuit.

Figure 13:
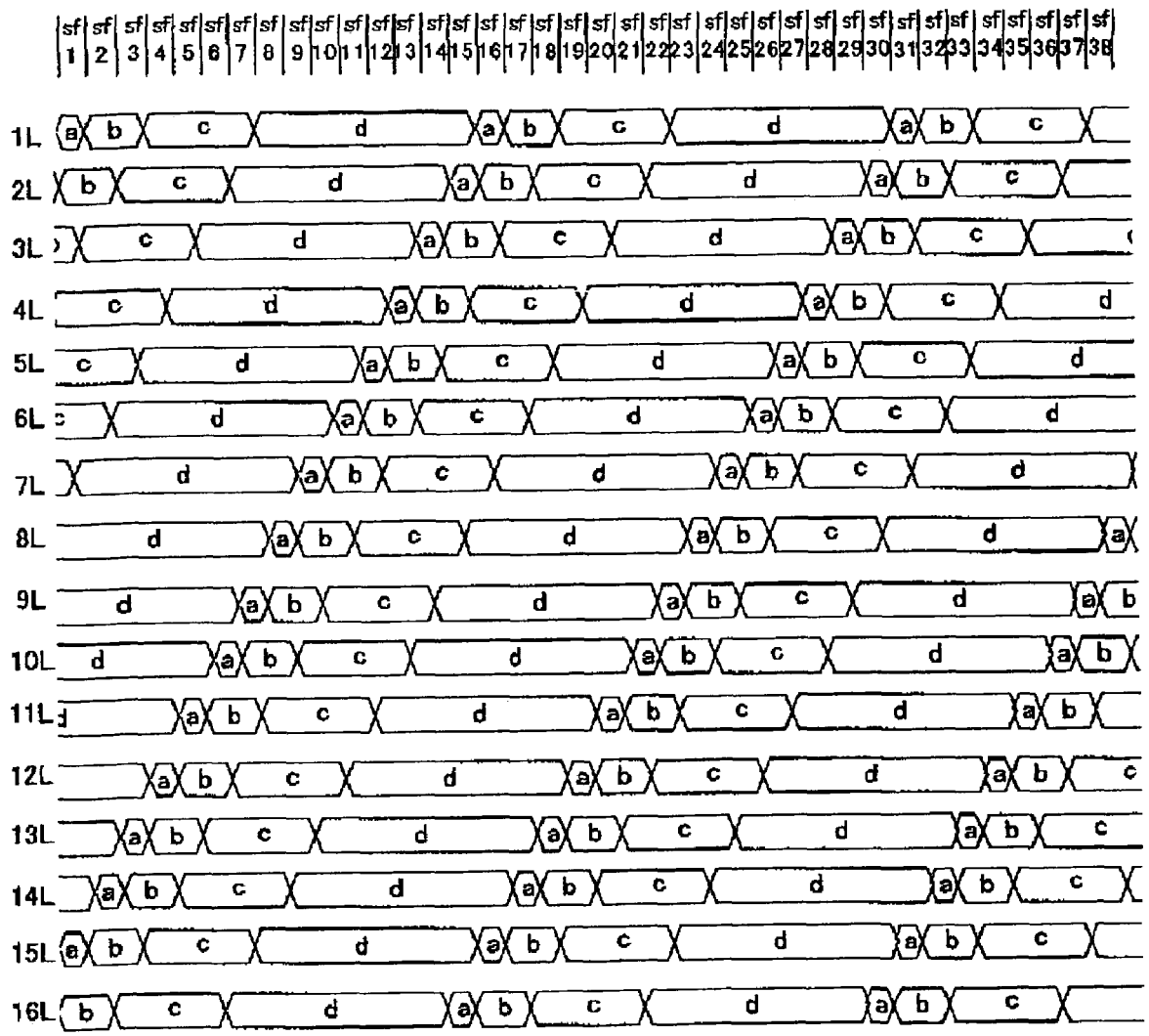
FIG. 13 is a timing chart illustrating the drive timing in a time division gradation drive method for the display device in Embodiment 5.

FIG. 13 is a timing chart illustrating the specific drive timing in this embodiment. As shown in FIG. 13, with the time division gradation drive method in this display device, the various pixel circuits are switched on and off by sub-fields (sf1 to sf17) produced by the time division of a single field (1f) according to the weight of 4-bit gradation data (dcba) (d is the MSB, and a is the LSB) indicating the gradation displayed by each pixel, and the weight reference time for gradation data is shifted by a sub-field for each scanning line. This time division gradation drive method has been disclosed in detail in Japanese Laid-Open Patent Applications 2001-166730 and 2001-166749 filed by the present applicant.

Further, the display device 1 of this embodiment can be applied to a wide variety of electronic devices. FIG. 14 shows examples of the electronic devices to which this display device 1 can be applied.

Figure 14A:
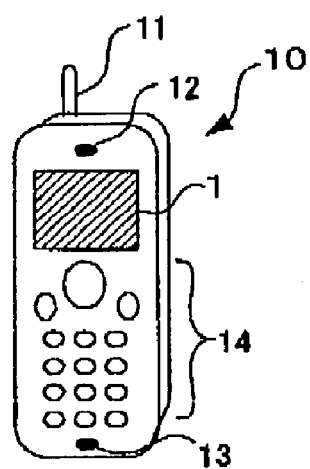
FIG. 14 consists of examples of the electronic devices in Embodiment 5, with FIG. 14A being an example of applying the display panel of the present invention to a cellular telephone, FIG. 14B to a video camera, FIG. 14C to a portable personal computer, FIG. 14D to a head-mounted display, FIG. 14E to a rear projector, and FIG. 14F to a front projector.

FIG. 14A is an example of application to a cellular telephone, in which this cellular telephone 10 comprises an antenna 11, an audio output component 12, an audio input component 13, a control pad 14, and the display device 1 of the present invention. The display device of the present invention can thus be utilized as a display.

Figure 14B:
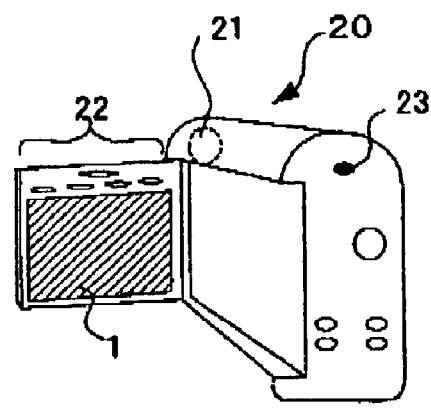

FIG. 14B is an example of application to a video camera, in which this video camera 20 comprises an image receiver 21, a control pad 22, an audio input component 23, and the display device 1 of the present invention. The display device of the present invention can thus be utilized as a viewfinder or a display.

Figure 14C:
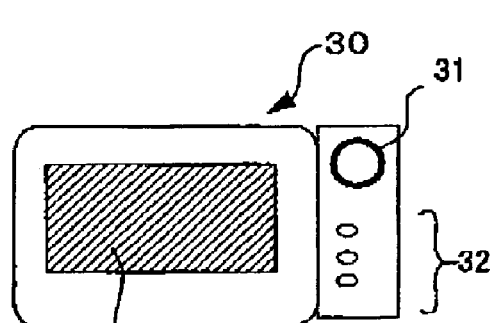

FIG. 14C is an example of application to a portable personal computer, in which this computer 30 comprises a camera 31, a control pad 32, and the display device 1 of the present invention. The display device of the present invention can thus be utilized as a display.

Figure 14D:
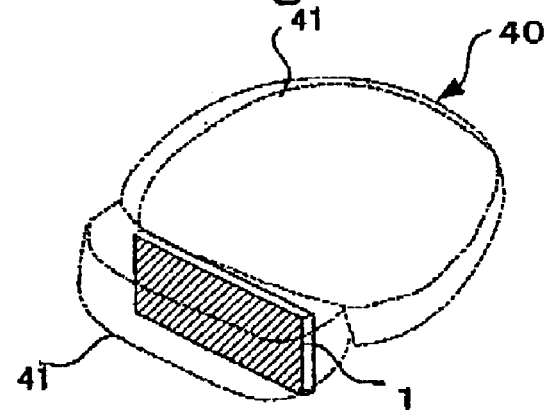

FIG. 14D is an example of application to a head-mounted display, in which this head-mounted display 40 comprises a band 41, an optical system holder 42, and the display device 1 of the present invention. The display device of the present invention can thus be utilized as an image display source.

Figure 14E:
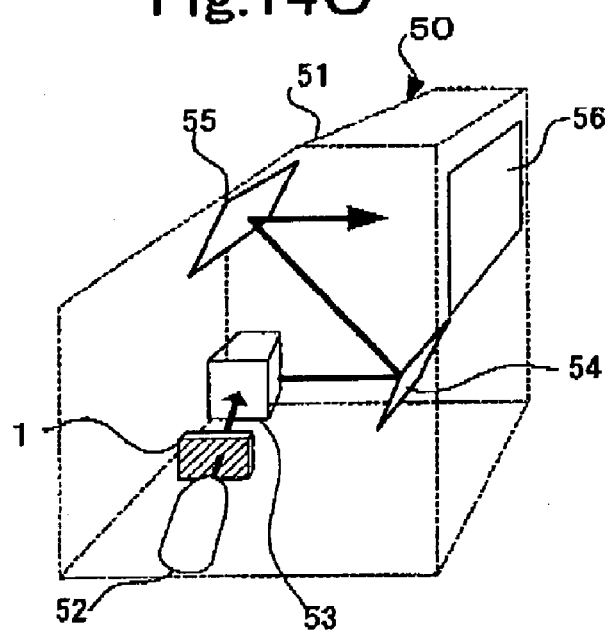

FIG. 14E is an example of application to a rear projector, and this projector 50 comprises a housing 51, a light source 52, a beam-combining optical system 53, mirrors 54 and 55, a screen 56, and the display device 1 of the present invention. The display device of the present invention can thus be utilized as an image display source.

Figure 14F:
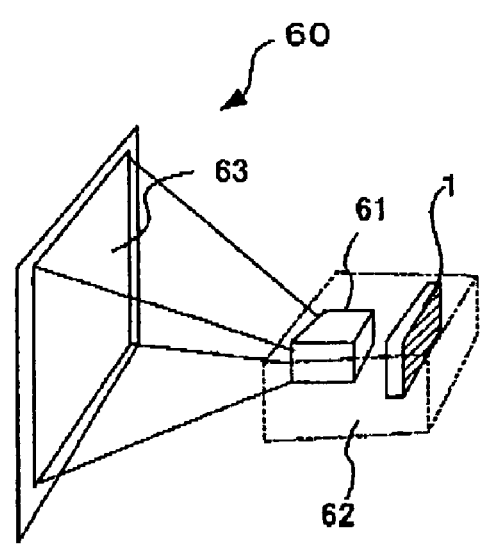

FIG. 14F is an example of application to a front projector, and this projector 60 comprises a housing 62, an optical system 61, and the display device 1 of the present invention, and images can be displayed on a screen 63. The display device of the present invention can thus be utilized as an image display source.

The electro-optical device manufactured by the manufacturing method of the present invention is not limited to the above examples, and can be applied to any electronic device to which an active matrix type of display device can be applied. For instance, in addition to the above, it can be put to use in fax machines having a display function, digital camera viewfinders, portable televisions, DSPs, PDAs, electronic notebooks, electro-optical signs, advertising displays, and so forth.

What is claimed is:

1. A method for manufacturing an electro-optical device, the method comprising:
    forming a release layer on a first substrate;
    forming on the release layer a plurality of pixel circuits, each of the pixel circuits having a pixel and being designed to drive the pixel;
    connecting at least one pixel circuit of the plurality of pixel circuits to wiring formed on a second substrate by bringing the at least one pixel circuit to a face of the second substrate;
    transferring the at least one pixel circuit from the first substrate to the second substrate by imparting an energy to a part of the release layer where the at least one pixel circuit is provided, the energy inducing a release occurring between the release layer and a layer adjacent to the release layer; and
    connecting the at least one pixel circuit to an electro-optical element formed on a third substrate through an electrical connection that is connected to the wiring formed on the second substrate.

2. The method for manufacturing an electro-optical device according to claim 1, further comprising, following forming the release layer, forming a boundary between one part of the release layer and an other part, for releasing the at least one pixel circuit according to a shape of the pixel circuit to be released.

3. The method for manufacturing an electro-optical device according to claim 1, further comprising, prior to connecting the at least one pixel circuit to the wiring on the second substrate, mutually separating a plurality of pixel circuits formed on the release layer.

4. The method for manufacturing an electro-optical device according to claim 1, wherein the method further comprises:
    forming bumps for electrically connecting the wiring with the electro-optical elements formed on the third substrate.

5. The method for manufacturing an electro-optical device according to claim 1, wherein, the electrical connection connecting the wiring and the electro-optical element formed on the third substrates is in an area of the third substrate where light emission will not be hindered in the pixel area.

6. The method for manufacturing an electro-optical device according to claim 1, wherein the third substrate has an area formed thereon for the electrical connection to the wiring in an area other than the light emitting area of the electro-optical elements.

7. The method for manufacturing an electro-optical device according to claim 1, wherein each pixel corresponds to one of a plurality of primary colors for producing a color display, and a single color pixel is constituted by a group of the pixels corresponding to the plurality of primary colors.

8. An electro-optical device manufactured by the method for manufacturing an electro-optical device according to claim 7.

9. An electronic device equipped with the electro-optical device according to claim 8.

10. An electro-optical device manufactured by the method for manufacturing an electro-optical device according to claim 1.

11. An electronic device equipped with the electro-optical device according to claim 10.

12. The method for manufacturing an electro-optical device according to claim 1, wherein following the electrical connecting of the wiring to the electro-optical element formed on the third substrate, a gap between the wiring and the third substrate is filled with a sealing material.

13. A method for manufacturing an electro-optical device, the method comprising:
    forming a release layer on a first substrate;
    forming on the release layer a scan line drive circuit and/or a data line drive circuit, each of the scan line drive circuit and/or the data line drive circuit having a pixel and being designed to drive the pixel;
    connecting the scan line drive circuit and/or the data line drive circuit to wiring formed on a second substrate, by bringing the scan line drive circuit and/or the data line drive circuit to a face of the second substrate;
    transferring the scan line drive circuit and/or the data line drive circuit from the first substrate to the second substrate by imparting an energy to a part of the release layer where the scan line drive circuit and/or data line drive circuit is provided, the energy inducing a release occurring between the release layer and a layer adjacent to the release layer; and
    connecting the scan line drive circuit and/or the data line drive circuit to an electro-optical element formed on a third substrate through an electrical connection that is connected to the wiring formed on the second substrate.

14. The method for manufacturing an electro-optical device according to claim 13, further comprising, following forming the release layer, forming a boundary between one part of the release layer and an other part, for releasing the scan line drive circuit and/or the data line drive circuit according to a shape of the scan line drive circuit and/or the data line drive circuit to be released.

15. The method for manufacturing an electro-optical device according to claim 13, further comprising, prior to connecting the scan line drive circuit and/or the data line drive to the wiring on the second substrate, mutually separating a plurality of pixel circuits formed on the release layer.

16. The method for manufacturing an electro-optical device according to claim 13, wherein the method further comprises:

forming bumps for electrically connecting the wiring with the electro-optical elements formed on the third substrate.

17. The method for manufacturing an electro-optical device according to claim 13, wherein, the electrical connection connecting the wiring and the electro-optical elements formed on the third substrate is in an area of the third substrate where light emission will not be hindered in the pixel area.

18. The method for manufacturing an electro-optical device according to claim 13, wherein the third substrate has an area formed thereon for the electrical connection to the wiring in an area other than the light emitting area of the electro-optical elements.

19. An electro-optical device manufactured by the method for manufacturing an electro-optical device according to claim 13, wherein the scan line drive circuit and/or the data line drive circuit are designed to drive the pixel by time division gradation drive method.

20. The method for manufacturing an electro-optical device according to claim 13, wherein following the electrical connecting of the wiring to the electro-optical element formed on the third substrate, a gap between the wiring and the third substrate is filled with a sealing material.

* * * * *